US 6,706,647 B1

(12) United States Patent
Tsutsumi et al.

(10) Patent No.: US 6,706,647 B1
(45) Date of Patent: Mar. 16, 2004

(54) METHOD OF AND APPARATUS FOR MANUFACTURING SEMICONDUCTORS

(75) Inventors: Yoshitsugu Tsutsumi, Minori (JP); Yoshio Okamoto, Minori (JP); Hideki Tomioka, Hannou (JP); Akira Ohkawa, Oume (JP); Toshio Ando, Kunitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/524,510

(22) Filed: Mar. 13, 2000

(30) Foreign Application Priority Data

Apr. 16, 1999 (JP) .......................... 11-109965

(51) Int. Cl.$^7$ ............................ H01L 21/469

(52) U.S. Cl. ................. 438/785; 438/778; 438/758; 118/300; 118/620

(58) Field of Search .................. 438/785, 778, 438/758, 780, 942; 118/300, 620

(56) References Cited

U.S. PATENT DOCUMENTS

| | | | | |
|---|---|---|---|---|
| 6,054,395 A | * | 4/2000 | Knappenberger | 438/758 |
| 6,110,283 A | * | 8/2000 | Yamamuka et al. | 118/715 |
| 6,110,531 A | * | 8/2000 | Paz de Araujo et al. | 427/255.25 |
| 6,179,920 B1 | * | 1/2001 | Tarutani et al. | 118/715 |
| 6,189,482 B1 | * | 2/2001 | Zhao et al. | 118/723 |

(List continued on next page.)

FOREIGN PATENT DOCUMENTS

| | | | | |
|---|---|---|---|---|
| JP | 60202711 A | * | 10/1985 | B01D/47/00 |
| JP | 02049420 A | * | 2/1990 | H01L/21/20 |
| JP | 5-175134 | | 7/1993 | |
| JP | 8-181130 | | 7/1996 | |
| JP | 9-036108 | | 2/1997 | |
| JP | 10247645 A | * | 9/1998 | H01L/21/205 |

OTHER PUBLICATIONS

Japanese Patent Unexamined Publication No. 6–306181, Nov. 1994.
Japanese Patent Unexamined Publication No. 9–36108, Feb. 1997.
U.S. Patent No. 5,653,813, Berzing et al., Aug. 1997.
U.S. Patent No. 5,425,803, van Schzavendijk et al., Jun. 1995.
Notice of reason for rejection in corresponding Japanese Application No. H11–109965 with parts translated in English.

Primary Examiner—Matthew Smith
Assistant Examiner—Renzo N. Rocchegiani
(74) Attorney, Agent, or Firm—Antonelli, Terry, Stout & Kraus, LLP

(57) ABSTRACT

A method of and an apparatus for manufacturing semiconductors, in which a liquid raw material can be uniformly supplied onto a wafer and a gas required for film formation can be also uniformly supplied onto the wafer. A liquid raw material is sprayed from a tip end of a vaporizing nozzle into a vacuum chamber as liquid droplets, and is vaporized by heat generated from the wafer placed on a susceptor. When the liquid raw material is sprayed, a gas required for film forming reaction is supplied into the vacuum chamber from a gas supply pipe provided on an outer periphery of the vaporizing nozzle. The vaporizing nozzle and the gas supply pipe are formed to be concentric, and a liquid raw material spray port is formed centrally of the vaporizing nozzle. A gas supply port or ports on the gas supply pipe are formed on an outer peripheral portion of the vaporizing nozzle to be arranged in annular manner, and the liquid raw material spray port and the gas supply port or ports are formed to be in parallel to each other in a longitudinal direction. The gas supply port or ports are arranged in the same plane as the liquid raw material spray port is, or on an upstream side where the liquid raw material is supplied.

20 Claims, 4 Drawing Sheets

U.S. PATENT DOCUMENTS 6,194,628 B1 * 2/2001 Pang et al. ................. 588/900
6,220,202 B1 * 4/2001 Foster et al. ................ 118/723
6,235,112 B1 * 5/2001 Satoh ........................ 118/300
6,245,396 B1 * 6/2001 Nogami ...................... 427/562
6,271,498 B1 * 8/2001 Miyake et al. ......... 219/121.43

* cited by examiner

METHOD OF AND APPARATUS FOR MANUFACTURING SEMICONDUCTORS

BACKGROUND OF THE INVENTION

1. Field of The Invention

The invention relates to a method of and an apparatus for manufacturing semiconductors, in which a thin film for semiconductors is formed by particularly using a liquid raw material and a liquefied raw material obtained by liquefying a liquid raw material in manufacturing semiconductors.

2. Description of The Related Art

A conventional method of manufacturing a thin film for semiconductors includes a method of using a liquid raw material to spray the same under vacuum, applying the sprayed liquid to a substrate, heating the substrate to volatilize a volatile solvent in the liquid applied to the substrate to form a thin film. Japanese Patent Unexamined Publication No. 6-306181 discloses, as an embodiment of the conventional method, a method of and an apparatus for manufacturing an organic optical thin film.

FIG. 6 is a schematic view showing an apparatus disclosed in the publication described above.

In FIG. 6, a vacuum chamber 5 is exhausted and evacuated by a vacuum exhausting unit 6. A wafer 4 is held and heated on a susceptor 3. A liquid raw material, in which an organic optical thin film material or an inorganic optical thin film material is dissolved in a volatile solvent, passes an opening and closing mechanism portion 301 from within a liquid raw material tank 25 to be sprayed into the vacuum chamber 5 from a control nozzle unit 300. The sprayed liquid raw material makes liquid droplets in the vacuum to reach the wafer 4, which is held and heated on the susceptor 3, as it is, and is applied onto the wafer 4.

Then, a volatile component of the liquid raw material applied onto the wafer 4 in the liquid state is volatilized by heat from the susceptor 3 and a surface heating device 306, so that a solid component is left on the wafer 4 to form a film. At this time, the solvent component volatilized by heat makes gases to be discharged to the vacuum chamber 5. A part of the discharged gas is exhausted by the vacuum exhausting unit 6, but most of the discharged gas is adsorbed by a cold trap 304, which is cooled to a low temperature, and is again condensed to make a liquid to maintain a desired vacuum.

In addition, in FIG. 6, the reference numeral 11 denotes a vacuum gauge; 302 a shutter; 303 a substrate temperature measuring device; 305 a baking device; and 310 a vacuum pump. Further, the reference numeral 311 denotes a manipulator; 312 a substrate introducing device; 320 denotes a vacuum pump; 321 a mass spectroscope; 322 denotes an ionizing device; and 323 a gate valve.

Further, as for other conventional techniques, Japanese Patent Unexamined Publication No. 9-36108 describes a method of and an apparatus for manufacturing semiconductors. Japanese Patent Unexamined Publication No. 9-36108 is directed to enhancing a vaporizing efficiency of a liquid raw material to prevent unnecessary formation of a film within an apparatus, thereby improving productivity in manufacture of semiconductors.

To attain the object described above, the present apparatus is constructed such that a liquid raw material is pressure fed by a gas for delivery of the liquid raw material to be to a vaporizing nozzle, and the vaporizing nozzle is supplied with a carrier gas and a gas raw material. With the arrangement, the liquid raw material from the vaporizing nozzle is made to collide against a carrier gas and a gas raw material to make fine droplets within in a vacuum chamber, in which a thin film is to be manufactured, and is efficiently vaporized to form a thin film on the wafer.

Hereupon, it is possible to enhance productivity in semiconductors in a method of manufacturing semiconductors, if a gas required for film formation, for example, oxygen can be uniformly supplied to a wafer, and so kinds of films capable of film formation can be extended to films which can be formed by a liquid raw material and the above-described gas, in addition to films which can be formed only by a liquid raw material.

However, with the conventional technique described in Japanese Patent Unexamined Publication No. 6-306181 described above, there is not disclosed any means for uniformly supplying a gas required for film formation to a wafer within a vacuum chamber. Accordingly, at the time of heating a liquid raw material to deposit a thin film, it is not possible to supply the gas required for the film forming reaction to the wafer placed on a susceptor.

In the conventional technique described above, if a gas is required for the film forming reaction, a separate pipe, through which a necessary gas is supplied, must be connected to the vacuum chamber.

However, even with such arrangement, there is the need of a gas dispersing plate, a shower head and the like for uniformly supplying the gas to the wafer placed on the susceptor. As a result, films, which can be formed in such arrangement, will be greatly limited in terms of kind, so that the arrangement is made limitative in use to make it difficult to enhance productivity.

Thus, as described in Japanese Patent Unexamined Publication No. 9-36108, it is contemplated to supply a liquid raw material to a vaporizing nozzle together with a carrier gas and a gas raw material.

However, the technique described in Japanese Patent Unexamined Publication No. 9-36108 is directed to enhancing a vaporizing efficiency of a liquid raw material, and so provides an arrangement, in which a gas is positively made to collide against a liquid before the liquid is sprayed to the vacuum chamber.

When the liquid is positively made to collide against the gas, a difference in mass between droplets and the gas greatly varies the distribution of the gas, so that the gas required for film formation cannot be uniformly supplied to a wafer.

Further, when the gas is positively made to collide against the liquid before the liquid is sprayed in the vacuum chamber, the gas is in some cases promoted in dissolving into the liquid. When spraying the liquid, in which the gas is dissolved in large amount in the vacuum, bubbles are formed in large amount since the gas contained in the liquid tends to violently move into gas phase. These bubbles sometimes prevent the liquid and the gas from being supplied into the vacuum chamber, so that the gas required for film formation cannot be uniformly supplied to a wafer.

SUMMARY OF THE INVENTION

An object of the invention is to realize a method of manufacturing semiconductors and an apparatus for manufacturing semiconductors, in which a liquid raw material can be uniformly supplied to a wafer and a gas required for film formation can be uniformly supplied to a wafer.

In order to achieve the object described above, the invention is structured in the following manner.

(1) In a method of manufacturing a semiconductor, there are provided a step of making at least a part of a liquid raw material for a thin film to be formed on a substrate of a semiconductor fine droplets in a space in which the thin film is formed, and supplying the fine droplets to the substrate from a liquid raw material spray port, and a step of supplying a gas required for forming the thin film to the substrate from a gas supply port formed in a periphery of the liquid raw material spray port.

(2) Preferably, in the method described in the item (1) described above, the gas supply port is arranged at the same interval with respect to the substrate as the liquid raw material spray port, or is arranged in an upstream side of a side for supplying the liquid raw material in comparison with the liquid raw material spray port.

(3) Further, preferably, in the method described in the item (1) described above, the thin film is formed while the gas is intermittently supplied to the substrate.

(4) Further, preferably, in the method described in the item (1) described above, the thin film is formed by using a chemical vapor deposition reaction.

(5) Further, preferably, in the method described in the item (1) described above, the liquid raw material is obtained by liquefying a solid or dissolving the solid into a solvent.

(6) Further, in an apparatus for manufacturing a semiconductor, there are provided with vaporizing means which makes at least a part of a liquid raw material for a thin film to be formed on a substrate of a semiconductor fine droplets in a space in which the thin film is formed and has a liquid raw material droplet port for supplying the fine droplets to the substrate, and a gas supply pipe having a gas supply port which is formed in a periphery of the liquid raw material spray port and supplies a gas required for forming the thin film to the substrate.

(7) Preferably, in the apparatus described in the item (6) described above, the gas supply port is arranged at the same distance with respect to the substrate as the liquid raw material spray port, or is arranged in an upstream side of a side for supplying the liquid raw material in comparison with the liquid raw material spray port.

When the supply port for supplying the gas required for the thin film forming reaction is provided in the periphery of the liquid raw material spray port, it is possible supply the gas so that the gas is uniformly supplied on the surface of the substrate without preventing the liquid raw material from being sprayed.

DESCRIPTION OF THE PREFERRED EMBODIMENTS

Embodiments in accordance with the invention will be described hereinafter with reference to the accompanying drawings.

Figure 1:
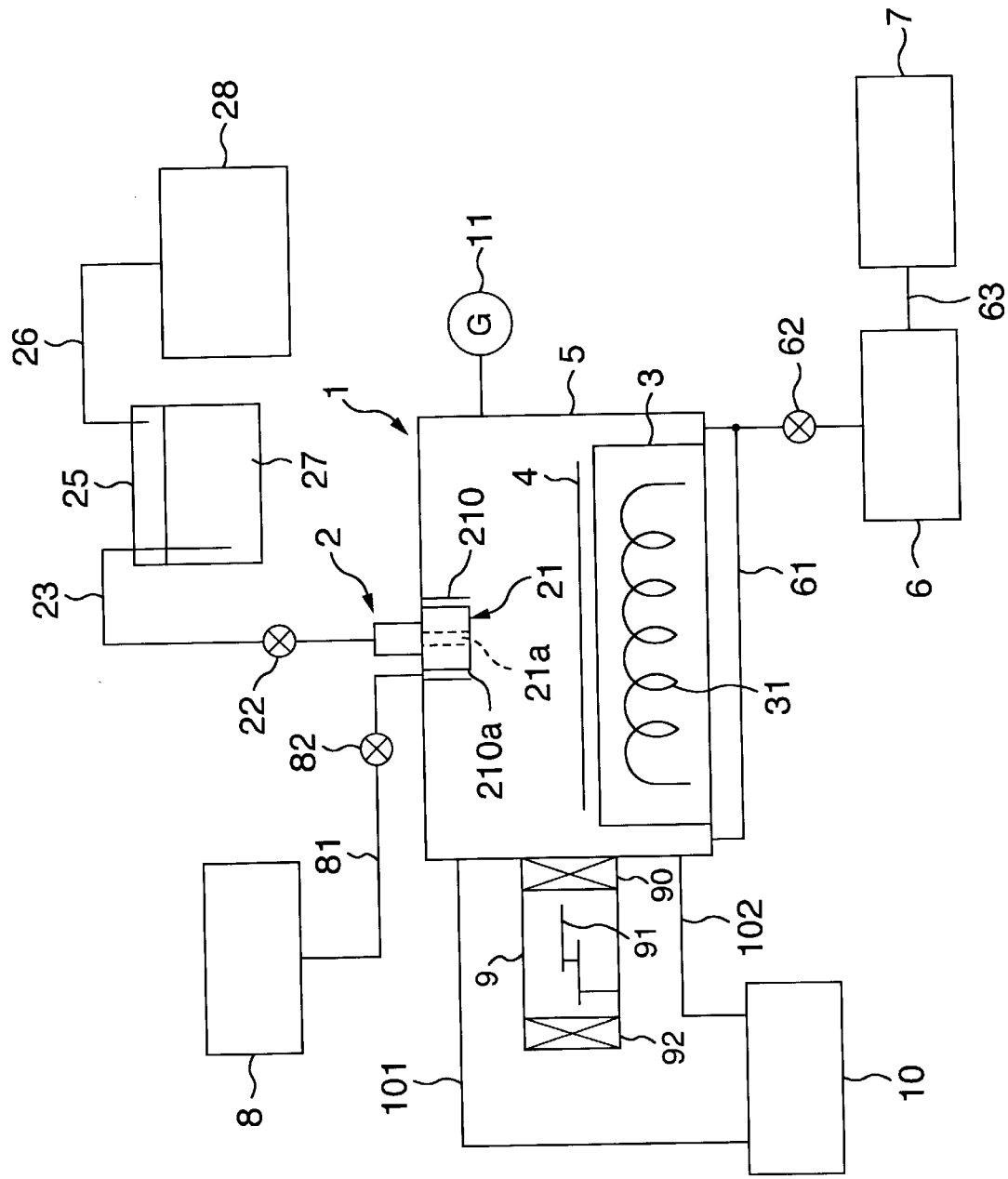
FIG. 1 is a schematic view showing an apparatus for manufacturing semiconductors, in accordance with a first embodiment of the invention.

FIG. 1 is a schematic view showing an apparatus for manufacturing semiconductors, in accordance with a first embodiment of the invention.

In FIG. 1, the reference numeral 1 denotes a vapor chemical reaction apparatus; 2 a vaporizing mechanism; 3 a susceptor; 4 a wafer; 5 a vacuum chamber; 6 an evacuation unit; 7 a gas processing unit; and 8 a gas supply unit.

Further, the reference numeral 9 denotes a preliminary chamber; 10 a wall surface temperature control unit; 11 a vacuum gauge; 21 a vaporizing nozzle; 22 a liquid raw material supply valve; 23 a liquid raw material supply pipe; 25 a liquid raw material tank; 26 a gas pipe for delivery of a liquid raw material; 27 a liquid raw material; 28 a gas supply unit for delivery of liquid raw material; and 31 a heater.

Further, the reference numeral 61 denotes an evacuation pipe; 62 an evacuation valve; 63 an exhaust pipe; 81 a gas supply pipe; 82 a gas supply valve; 91 a wafer handler; 82 a first gate valve in the preliminary chamber; 93 a second gate valve in the preliminary chamber; 101 a first pipe for wall surface temperature control; 102 a second pipe for wall surface temperature control; and 210 a gas supply pipe.

An operation in the first embodiment of the invention will be hereinbelow described, in which a liquid raw material is used.

In addition, the first embodiment in accordance with the invention will be exemplarily described, in which a reduced pressure gas phase chemical vapor deposition reaction is used for a method of manufacturing a thin film for semiconductors. Further, while one kind of a liquid raw material 27 is used in this embodiment, film formation (formation of a thin film) can be effected by carrying out the same procedure even in the case where a plural kinds of liquid raw material preliminary chamber are used.

First, the exhausting unit 6 evacuates the vacuum chamber 5. Then, an inert gas from the gas supply unit 8 is introduced to the vacuum chamber 5 through the exhaust pipe 81, the gas supply pipe 82 and the gas supply pipe 210. Then, supplying of the inert gas is stopped, and the exhausting unit 6 again evacuates the vacuum chamber 5. Such evacuation and introduction of the inert gas are repeated several times to effect gas exchange in the vacuum chamber 5.

Then, a wafer 4 held in the preliminary chamber 9 is conveyed onto the susceptor 3, which is heated by the heater 31, by opening the first gate valve 92. Thereafter, gas exchange is again effected within the vacuum chamber 5. After the gas exchange, the liquid raw material 27 and the gas raw material are supplied to effect film formation. After the film formation, gas exchange is effected to permit the wafer 4 on the susceptor 3 to be replaced by a wafer placed in the preliminary chamber 9.

The operation described above constitutes a manufacturing cycle in the reduced pressure gas phase chemical vapor deposition apparatus.

Next, an operation in the case where the liquid raw material 27 and a gas are required for film formation will be described in details.

The liquid raw material 27 is pressure fed from the liquid raw material tank 25 by means of a gas for delivery of a liquid raw material, which gas is supplied from the gas supply unit 28 for delivery of a liquid raw material via the gas pipe 26 for delivery of a liquid raw material. Then, the liquid raw material 27 having been pressure fed from the liquid raw material tank 25 passes through the liquid raw material supply pipe 23 to be supplied to the vaporizing nozzle 21 via the liquid raw material supply valve 22.

The liquid raw material 27 is sprayed from a tip end of the vaporizing nozzle 21 into the vacuum chamber 5 as liquid droplets having a very small diameter. The liquid droplets as sprayed is vaporized by heat generated from the wafer 4 placed on the susceptor 3. When the liquid raw material 27 is sprayed from the tip end of the vaporizing nozzle 21, the gas required for the film forming reaction is supplied from the gas supply unit 8 into the vacuum chamber 5 through the gas supply pipe 81, the gas supply valve 82 and the gas supply pipe 210 provided on the outer periphery of the vaporizing nozzle 21.

Figure 2:
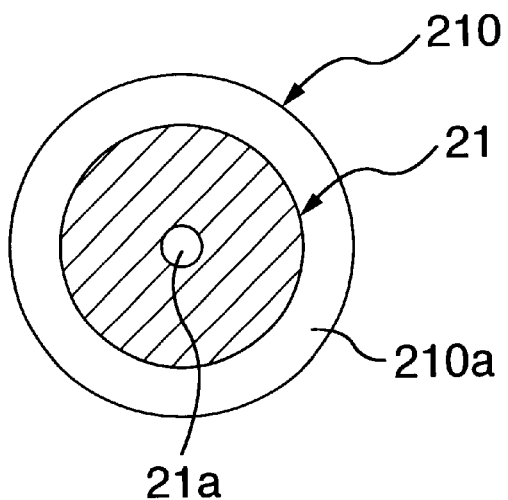
FIG. 2 is a plan view showing a vaporizing nozzle and a gas supply pipe in accordance with the invention.

FIG. 2 is a plan view showing the vaporizing nozzle 21 and the gas supply pipe 210.

In FIG. 2, the vaporizing nozzle 21 and the gas supply pipe 210 are formed to be concentric, and a liquid raw material spray port 21a is formed centrally of the vaporizing nozzle 21. Then, the gas supply port 210a of the gas supply pipe 210 is formed to be annular on an outer peripheral portion of the vaporizing nozzle 21. Further, the vaporizing nozzle 21 and the gas supply pipe 210 are formed to be in parallel to each other in a direction along a normal line relative to a paper surface (a longitudinal direction of the liquid spray port 21a and the gas supply port 210a), that is, in a direction along a normal line relative to a plane, which includes the liquid raw material spray port 21a. Further, the gas supply port 210a is disposed on the same plane as the liquid raw material spray port 21a is or on an upstream side of the port, to which the liquid raw material is supplied (the gas supply port 210a is disposed substantially the same spacing from the substrate (the wafer 4) as that of the liquid raw material spray port 21a from the substrate or on an upstream side of the liquid raw material spray port 21a, to which the liquid raw material is supplied).

Accordingly, the gas required for film formation is uniformly supplied onto the wafer 4 placed on the susceptor 3. Further, at this time, the supplied gas does not interfere with spraying of the liquid raw material 27.

As described above, in accordance with the first embodiment of the invention, the vaporizing nozzle 21 and the gas supply pipe 210 are formed to be concentrical, the liquid raw material spray port 21a is formed centrally of the vaporizing nozzle 21, and the gas supply port 210a of the gas supply pipe 210 is annularly formed to be annular on the outer peripheral portion of the vaporizing nozzle 21.

Further, the vaporizing nozzle 21 and the gas supply pipe 210 are formed to be in parallel to each other in a direction along a normal line relative to a paper surface, that is, in a direction along a normal line relative to a plane, which includes the liquid raw material spray port 21a. Further, the gas supply port 210a is disposed on the same plane as the liquid raw material spray port 21a is or on an upstream side of the port, to which the liquid raw material is supplied.

Accordingly, it is possible to realize a method of manufacturing semiconductors and an apparatus for manufacturing semiconductors, in which a liquid raw material can be uniformly supplied to a wafer and a gas required for film formation can be uniformly supplied to a wafer.

Further, in the first embodiment of the invention, since the gas surrounds an outer side of the liquid droplets of the liquid raw material 27, the liquid raw material 27 does not diffuse and scatter onto the wall surface within the vacuum chamber 5, in which film formation is effected. Accordingly, the invention is effective in avoiding adherence of unnecessary film within the vacuum chamber 5.

Further, the invention is effective in adjusting an amount of the gas supplied from the gas supply pipe 210 to enable controlling an expansion in a plane including the liquid raw material spray port 21a, over which atomize liquid droplets of the liquid raw material 27 sprayed into the vacuum chamber 5 from the vaporizing nozzle 21 are atomized.

Figure 3:
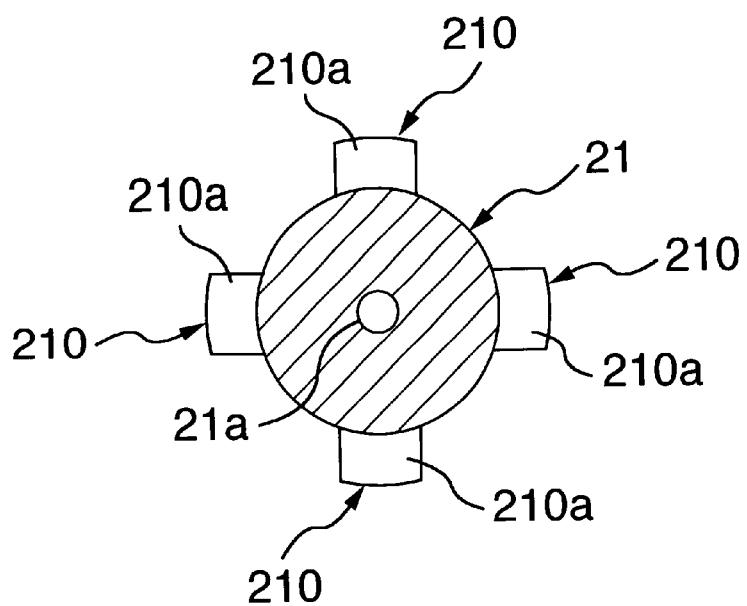
FIG. 3 is a plan view showing a vaporizing nozzle and a gas supply pipe in accordance with a second embodiment of the invention.

FIG. 3 is a plan view showing a vaporizing nozzle 21 and a gas supply pipe 210 in a semiconductor manufacturing apparatus in accordance with a second embodiment of the invention.

In FIG. 3, the same reference numerals designate the same elements as those shown in FIG. 2. Further, the entire procedure at the time of film formation is quite the same as that in the embodiment shown in FIG. 1, and so illustration and a detailed description thereof will be omitted.

In the embodiment shown in FIG. 3, the vaporizing nozzle 21 is formed to have the same shape as that in the embodiment shown in FIG. 2. Then, the gas supply pipe 210 comprises a plurality of tubular gas supply ports 210a arranged on a peripheral edge of the vaporizing nozzle 21.

The plurality of gas supply ports 210a and the liquid raw material spray port 21a are formed in the same manner as in the embodiment of FIG. 2 to be in parallel to each other in a direction along a normal line relative to a paper surface, that is, in a direction along a normal line relative to a plane, which includes the liquid raw material spray port 21a. Further, the gas supply ports 210a are disposed on the same plane as the liquid raw material spray port 21a is or on an upstream side of the port, to which the liquid raw material is supplied.

As described above, according to the second embodiment of the invention, the gas supply pipes 210, to which the gas is supplied, are plural in number. The same effect as that in the first embodiment can be also obtained in such arrangement of the second embodiment.

Figure 4:
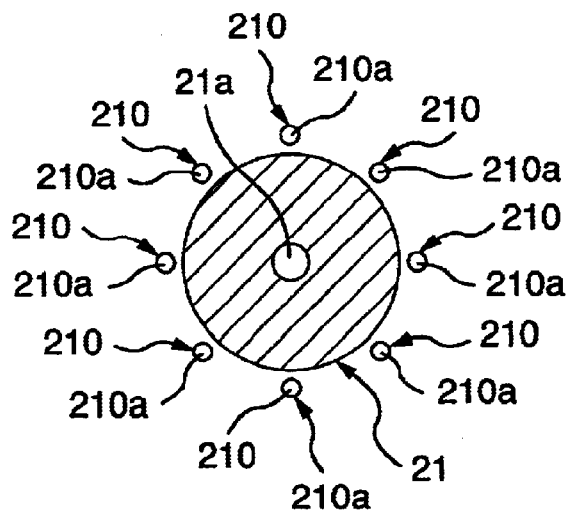
FIG. 4 is a plan view showing a modification of the second embodiment of the invention.

In addition, while the four rectangular gas supply ports 210a are formed in the embodiment shown in FIG. 3, the gas supply ports 210a in the gas supply pipes 210 may be configured to have a closed curve such as a circular shape or the like and may be one or more in number as shown in FIG. 4 (eight in an embodiment shown in FIG. 4).

In the second embodiment of the invention, as described above, a similar effect to that in the first embodiment can be obtained, and besides the gas supply ports 210a is separately grouped into a plurality of ones, so that it is characteristically possible to control amounts of the gas at the respective supply ports independently of one another.

Figure 5:
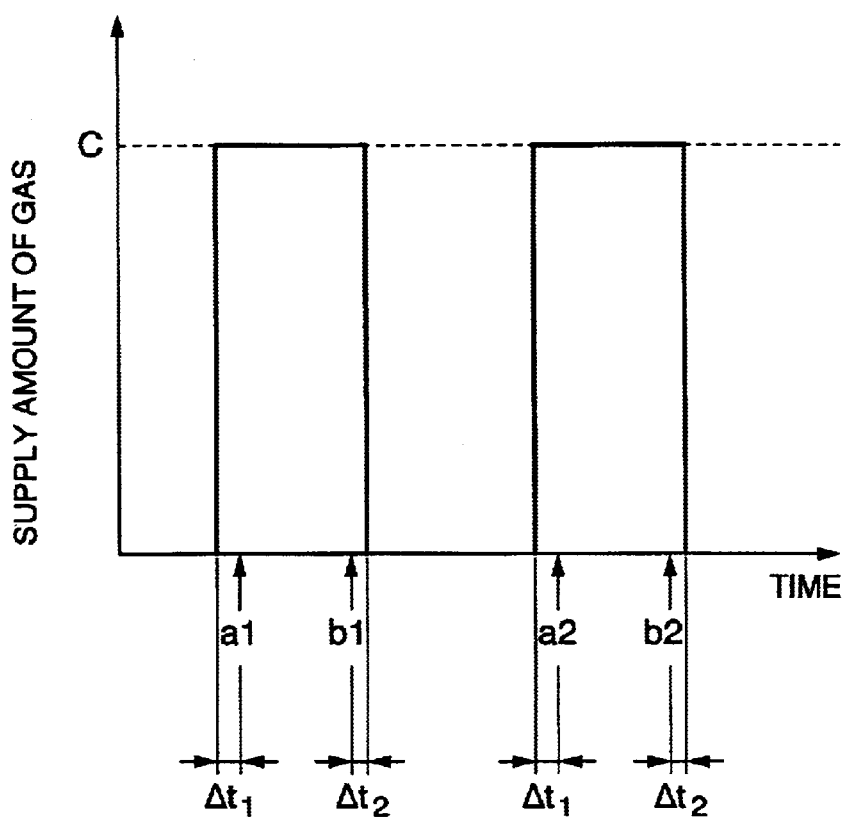
FIG. 5 is a timing chart associated with a third embodiment of the invention.
Figure 6:
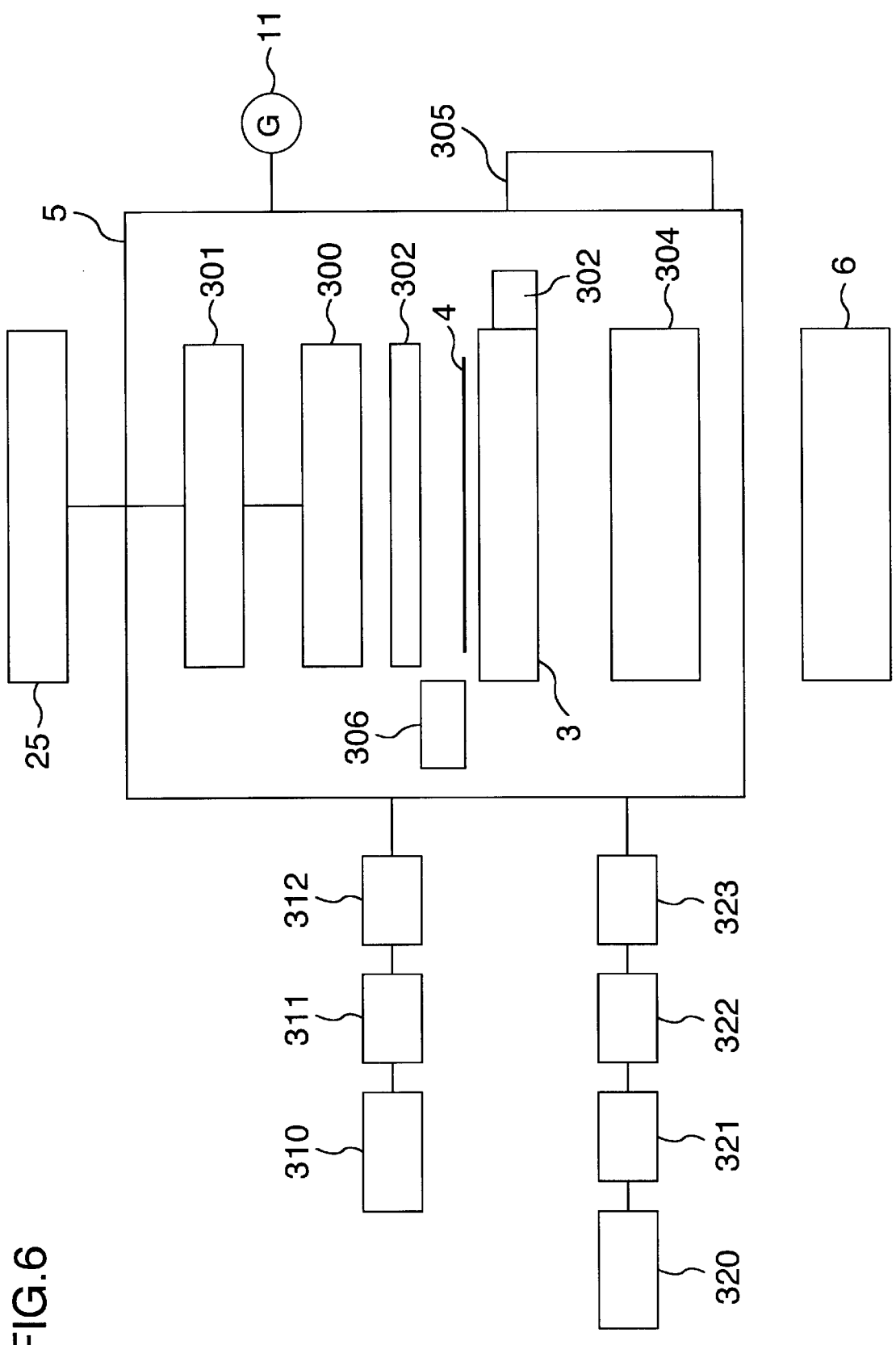
FIG. 6 is a schematic view showing a conventional apparatus.

FIG. 5 is a timing chart for supplying of the gas required for film formation in the semiconductor manufacturing apparatus according to the third embodiment of the invention. In addition, the arrangement and constitution of the apparatus according to the third embodiment are the same as those of the first embodiment or the second embodiment, and the entire procedure at the time of film formation is quite the same as that in the embodiment shown in FIG. 1, and so the description thereof will be omitted here.

In the third embodiment, while film formation is carried out, the gas required for film formation is not continuously supplied but intermittently supplied in a specified relationship with a timing, at which the liquid raw material 27 is intermittently supplied from the vaporizing nozzle 21.

In FIG. 5, abscissa indicates time and ordinate indicates a supply amount of the gas.

In FIG. 5, the liquid raw material is sprayed into the vacuum chamber 5 from the vaporizing nozzle 21 at a point of time a1. A duration Δt1 before the point of time a1, a predetermined amount C of the gas required for film formation is supplied into the vacuum chamber 5 from the gas supply pipe 210. Then, at a point of time b1 supplying of the liquid raw material 27 is stopped. A duration Δt2 after the point of time b1, supplying of the gas required for film formation is stopped.

In a similar manner, the liquid raw material 27 is sprayed into the vacuum chamber 5 from the vaporizing nozzle 21 at a point of time a2. In the same manner as in the last time, a duration Δt1 just before the point of time a2, a predetermined amount C of the gas required for film formation is supplied into the vacuum chamber 5 from the gas supply pipe 210. Then, at a point of time b2, supplying of the liquid raw material 27 is stopped and a duration Δt2 somewhat after the time b2, supplying of the gas required for film formation is stopped.

Hereinafter, the process of stopping the supply of the liquid raw material 27 are repeated several times to perform film formation. In addition, the duration Δt1 permits the gas and the liquid raw material to reach the wafer substantially at the same time, and about one second is sufficient therefor. Further, since the liquid raw material not reaching the wafer is left even after spraying of the liquid raw material is stopped, the duration Δt2 provides for a delay time, in which the gas corresponding with the liquid raw material left is permitted to jet. About one second is also sufficient for the duration Δt2.

These durations Δt1 and Δt2 can be set every apparatus to be used.

As described above, the third embodiment of the invention produces, in addition to the effects produced by the first embodiment, an effect that an amount of the gas used for film formation can be reduced—since the gas required for film formation is not continuously supplied but intermittently supplied in a predetermined relationship with a timing that the liquid raw material is intermittently supplied from the vaporizing nozzle.

As described above, in accordance with the invention, the gas required for film formation is uniformly supplied onto the wafer placed on the susceptor 3 together with the liquid raw material 27, whereby a kind of film, which enables film formation, is applicable to one capable of film formation with the liquid raw material 27 and the gas, as well as one capable of film formation with only the liquid raw material 27. Accordingly, the apparatus is widened in a range of application, and productivity is enhanced.

In addition, the gas supply port or ports 210a are arranged in the same plane as that for the liquid raw material spray port 21a or on the upstream side where the liquid raw material is supplied, but can be arranged on a downstream side of the liquid raw material spray port 21a where the liquid raw material is supplied, provided that a divergent angle, at which the liquid is sprayed from the liquid raw material spray port 21a, is adjusted to prevent the gas supplied from the gas supply port 210a from interfering with spraying of the liquid raw material 27.

In accordance with the invention, it is possible to realize a method of and an apparatus for manufacturing semiconductors, in which the liquid raw material can be uniformly supplied onto the wafer and the gas required for film formation can be also uniformly supplied onto the wafer.

Accordingly, the gas required for film formation is uniformly supplied onto the wafer together with the liquid raw material, whereby a kind of film, which enables film formation, is applicable to one capable of film formation with the liquid raw material 27 and the gas, as well as one capable of film formation with only the liquid raw material 27.

What is claimed is:

1. A method of manufacturing semiconductors, said method comprising the steps of: forming fine droplets from at least a part of a liquid raw material for a thin film to be formed on a substrate of a semiconductor, to supply the fine droplets into an area in which the substrate is arranged, and supplying the fine droplets directly toward said substrate from a liquid raw material spray port, and supplying a gas required for forming said thin film directly to said substrate from a gas supply port or ports circularly surrounding said liquid raw material spray port so that the gas supplied from the gas supply port or ports circularly surrounds liquid droplets sprayed from the liquid raw material spray port.

2. The method as claimed in claim 1, wherein said gas supply port or ports are arranged substantially the same spacing from said substrate, as said liquid raw material spray port is, or on an upstream side of said liquid raw material spray port, from which the liquid raw material is sprayed.

3. The method as claimed in claim 1, wherein said thin film is formed while said gas is intermittently supplied to said substrate.

4. The method as claimed in claim 1, wherein said thin film is formed by means of the chemical vapor deposition reaction.

5. The method as claimed in claim 1, wherein said liquid raw material is obtained by liquefying a solid or dissolving the solid into a solvent.

6. An apparatus for manufacturing semiconductors, comprising a liquid raw material spray port located in front of a substrate of a semiconductor for forming fine droplets from at least a part of a liquid raw material for a thin film to be formed on the substrate of the semiconductor, in a space, in which the thin film is formed, to supply the fine droplets directly to said substrate from a liquid raw material spray port, and a gas supply pipe having a gas supply port or ports located in front of the substrate of the semiconductor, which circularly surround said liquid raw material spray port and through which a gas required for forming said thin film is supplied directly to said substrate so that the gas supplied from the gas supply port or ports circularly surrounds liquid droplets sprayed from the liquid raw material spray port.

7. The apparatus as claimed in claim 6, wherein said gas supply port or ports are arranged substantially the same spacing from said substrate, as said liquid raw material spray port is, or on an upstream side of said liquid raw material spray port, from which the liquid raw material is sprayed.

8. A method of manufacturing a semiconductor apparatus, the method comprising the steps of: supplying a raw material from at least a part of a liquid raw material for a thin film to be formed, into a low pressure atmosphere in which the thin film is formed from a raw material spray port located in front of a semiconductor wafer; and supplying a gas required for forming said thin film, into said low pressure atmosphere from a gas supply port or ports circularly surrounding said liquid raw material spray port located in front of the semiconductor wafer so that the gas supplied from the gas supply port or ports circularly surrounds liquid droplets sprayed from the liquid raw material spray port, wherein said raw material is supplied directly toward said semiconductor wafer from said raw material spray port.

9. The method according to claim 8, further comprising after the step of supplying said raw material, supplying said gas.

10. The method according to claim 8, further comprising after the steps of supplying said raw material and supplying said gas, reducing the supply of said raw material and then reducing the supply of said gas.

11. The method according to claim 8, wherein after the steps of supplying said raw material, supplying said gas, reducing the supply of said raw material, and reducing the supply of said gas, these steps are repeated.

12. A method of manufacturing a semiconductor apparatus, the method comprising the steps of: supplying a raw material from at least a part of a liquid raw material for a thin film to be formed, into a low pressure atmosphere in which the thin film is formed from a liquid raw material spray port located in front of a semiconductor wafer; and supplying a gas required for forming said thin film, into said low pressure atmosphere from a gas supply port or ports circularly surrounding said liquid raw material spray port located in front of the semiconductor wafer so that the gas supplied from the gas supply port or ports circularly surrounds liquid droplets sprayed from the liquid raw material spray port, wherein said gas is supplied such that said supplied gas does not interfere with said liquid raw material in said low pressure atmosphere.

13. A method of manufacturing a semiconductor apparatus, the method comprising the steps of: supplying a raw material from at least a part of a liquid raw material for a thin film to be formed, into a low pressure atmosphere in which the thin film is formed from a liquid raw material spray port located in front of a semiconductor wafer; and supplying a gas required for forming said thin film, into said low pressure atmosphere from a gas supply port or ports circularly surrounding said liquid raw material spray port located in front of the semiconductor wafer, wherein said raw material is supplied directly toward said semiconductor wafer from said liquid raw material spray port, and wherein said gas from the gas supply port or ports formed around said liquid raw material spray port is supplied so that the gas supplied from the gas supply port or ports circularly surrounds liquid droplets sprayed from the liquid raw material spray port and so that the gas prevents diffusion and scattering of the liquid raw material as it is supplied toward the semiconductor wafer.

14. A method of manufacturing a semiconductor apparatus, the method comprising the steps of: supplying a raw material from at least a part of a liquid raw material for a thin film to be formed, into a low pressure atmosphere in which the thin film is formed from a raw material spray port located in front of a semiconductor wafer; and supplying a gas required for forming said thin film, into said low pressure atmosphere from a gas supply port or ports circularly surrounding said liquid raw material spray port located in front of the semiconductor wafer so that the gas supplied from the gas supply port or ports circularly surrounds liquid droplets sprayed from the liquid raw material spray port, wherein said raw material is supplied directly toward said semiconductor wafer from said raw material spray port, and wherein an amount of gas supplied from the gas supply port or ports formed around said liquid raw material spray port is adjusted so that diffusion and scattering of the liquid raw material as it is supplied toward the semiconductor wafer is controlled.

15. An apparatus for making a thin film for a semiconductor, the apparatus comprising:

a liquid raw material spray port for supplying fine droplets of at least a part of a liquid raw material for a thin film to be formed, one or more gas supply ports for supplying a gas required for forming the thin film to be formed, wherein the liquid raw material spray port is located in front of a substrate on which the thin film is to be formed so that the fine droplets are supplied directly to the substrate from the liquid raw material spray port and wherein the one or more gas supply ports circularly surround the liquid raw material supply port so that the gas required for film formation is supplied directly to the substrate from the one or more gas supply ports so that the gas supplied from the gas supply port or ports circularly surrounds liquid droplets sprayed from the liquid raw material spray port.

16. A method for forming a thin film, the method comprising providing an apparatus comprising:

a liquid raw material spray port for supplying fine droplets of at least a part of a liquid raw material for a thin film to be formed, one or more gas supply ports for supplying a gas required for forming the thin film to be formed, wherein the liquid raw material spray port is located in front of a substrate on which the thin film is to be formed so that the fine droplets are supplied directly to the substrate from the liquid raw material spray port and wherein the one or more gas supply ports circularly surround the liquid raw material supply port so that the gas required for film formation is supplied directly to the substrate from the one or more gas supply ports, and so that the gas supplied from the gas supply port or ports circularly surrounds liquid droplets sprayed from the liquid raw material spray port; and supplying fine droplets of a liquid raw material so that the fine droplets are directed from the liquid raw material spray port directly to the substrate and supplying the gas required for film formation so that the gas is directed from the one or more gas supply ports directly to the substrate.

17. A method for manufacturing a semiconductor device with a thin layer on semiconductor wafer, comprising the steps of supplying a raw material into a low pressure atmosphere from a raw material spray port in front of the semiconductor wafer so that the thin layer is formed on the semiconductor wafer in the low pressure atmosphere, and supplying a gas required for forming the thin layer, into the low pressure atmosphere from at least one gas supply port circularly surrounding the raw material spray port, wherein the raw material spray port starts supplying the raw material into the low pressure atmosphere after the at least one gas supply port starts supplying the gas into the low pressure atmosphere, and the at least one gas supply port stops supplying the gas into the low pressure atmosphere after the raw material spray port stops supplying the raw material into the low pressure atmosphere.

18. A method according to claim 17, wherein the at least one gas supply port restarts supplying the gas into the low pressure atmosphere before the raw material spray port restarts supplying the raw material into the low pressure atmosphere, and subsequently the at least one gas supply port stops supplying the gas into the low pressure atmosphere after the raw material spray port stops supplying the raw material into the low pressure atmosphere.

19. An apparatus for manufacturing a semiconductor device with a thin layer on a semiconductor wafer in a low pressure atmosphere by using a raw material and a gas, comprising

- a raw material spray port arranged in front of the semiconductor wafer to supply the raw material into the low pressure atmosphere so that the thin layer is formed on the semiconductor wafer in the low pressure atmosphere, and
- at least one gas supply port circularly surrounding the raw material spray port, for supplying the gas into the low pressure atmosphere,
- wherein the raw material spray port starts supplying the raw material into the low pressure atmosphere after the at least one gas supply port starts supplying the gas into the low pressure atmosphere, and
- the at least one gas supply port stops supplying the gas into the low pressure atmosphere after the raw material spray port stops supplying the raw material into the low pressure atmosphere.

20. An apparatus for manufacturing a semiconductor device with a thin layer on a semiconductor wafer in a low pressure atmosphere by using a raw material and a gas, comprising

- a raw material spray port arranged in front of the semiconductor wafer to supply the raw material into the low pressure atmosphere so that the thin layer is formed on the semiconductor wafer in the low pressure atmosphere, and
- at least one gas supply port circularly surrounding the raw material spray port, for supplying the gas into the low pressure atmosphere,
- wherein the raw material spray port starts supplying the raw material into the low pressure atmosphere after the at least one gas supply port starts supplying the gas into the low pressure atmosphere, and
- the at least one gas supply port stops supplying the gas into the low pressure atmosphere after the raw material spray port stops supplying the raw material into the low pressure atmosphere,
- wherein the at least one gas supply port restarts supplying the gas into the low pressure atmosphere before the raw material spray port restarts supplying the raw material into the low pressure atmosphere, and subsequently the at least one gas supply port stops supplying the gas into the low pressure atmosphere after the raw material spray port stops supplying the raw material into the low pressure atmosphere.

* * * * *